United States Patent
Campbell

(10) Patent No.: US 10,845,384 B2
(45) Date of Patent: Nov. 24, 2020

(54) SURFACE-MOUNTABLE APPARATUS FOR COUPLING A TEST AND MEASUREMENT INSTRUMENT TO A DEVICE UNDER TEST

(71) Applicant: Tektronix, Inc., Beaverton, OR (US)

(72) Inventor: Julie A. Campbell, Beaverton, OR (US)

(73) Assignee: Tektronix. Inc., Beaverton, OR (US)

( * ) Notice: Subject to any disclaimer, the term of this patent is extended or adjusted under 35 U.S.C. 154(b) by 0 days.

(21) Appl. No.: 16/363,790

(22) Filed: Mar. 25, 2019

(65) Prior Publication Data

US 2019/0353682 A1 Nov. 21, 2019

Related U.S. Application Data

(63) Continuation-in-part of application No. 15/806,270, filed on Nov. 7, 2017, now Pat. No. 10,241,133.

(60) Provisional application No. 62/821,972, filed on Mar. 21, 2019.

(51) Int. Cl.
  *G01R 1/067* (2006.01)
  *G01R 13/20* (2006.01)
  *G01R 15/20* (2006.01)

(52) U.S. Cl.
  CPC ....... *G01R 1/06722* (2013.01); *G01R 13/208* (2013.01); *G01R 15/202* (2013.01)

(58) Field of Classification Search
  CPC .... H01F 1/00; G01R 1/00; H01R 3/00; H01R 2101/00
  See application file for complete search history.

(56) References Cited

U.S. PATENT DOCUMENTS

| | | | |
|---|---|---|---|
| 5,168,256 A | 12/1992 | Ishiguro et al. | |
| 5,581,130 A * | 12/1996 | Boucheron | B60R 16/0238 307/10.1 |
| 6,373,273 B2 * | 4/2002 | Akram | G01R 1/0483 257/730 |
| 2010/0073018 A1 * | 3/2010 | Ruppelt | G01R 1/06705 324/755.01 |
| 2010/0176828 A1 * | 7/2010 | Eccleston | G01R 1/06788 324/755.01 |
| 2013/0033280 A1 * | 2/2013 | Engquist | G01R 1/06733 324/755.01 |
| 2014/0176176 A1 * | 6/2014 | McGrath, Jr. | G01R 31/2889 324/755.05 |

FOREIGN PATENT DOCUMENTS

| | | |
|---|---|---|
| JP | H06267710 | 9/1994 |
| JP | H0886808 | 4/1996 |

* cited by examiner

*Primary Examiner* — Jermele M Hollington
*Assistant Examiner* — Temilade S Rhodes-Vivour
(74) *Attorney, Agent, or Firm* — Miller Nash Graham & Dunn; Andrew J. Harrington

(57) ABSTRACT

An apparatus for coupling a test and measurement instrument to a device under test comprises a clip structured to be attached between two conductive portions of the device under test, and an insert structured to be removably installed in the clip. The insert is configured to provide a current path between the two conductive portions of the device under test. In embodiments, the insert comprises a resistive element, which may be a round rod resistor. Additional embodiments may be described and/or claimed herein.

19 Claims, 10 Drawing Sheets

SURFACE-MOUNTABLE APPARATUS FOR COUPLING A TEST AND MEASUREMENT INSTRUMENT TO A DEVICE UNDER TEST

CROSS-REFERENCES TO RELATED APPLICATIONS

The present application is a continuation-in-part of U.S. Non-Provisional patent application Ser. No. 15/806,270, filed Nov. 7, 2017, entitled "PROBE TIP AND PROBE ASSEMBLY." In addition, the present application claims the benefit from U.S. Provisional Patent Application Ser. No. 62/821,972, filed Mar. 21, 2019, entitled "SURFACE-MOUNTABLE APPARATUS FOR COUPLING A TEST AND MEASUREMENT INSTRUMENT TO A DEVICE UNDER TEST." Both of these related applications are incorporated herein by reference as if reproduced in their entirety.

TECHNICAL FIELD

This disclosure relates to test and measurement systems, and more particularly to test and measurement probes.

BACKGROUND

Today's engineers are attempting to test devices that carry high-speed serial busses. Many of these devices can be identified as, but are not limited to, double data rate second generation (DDR2) synchronous dynamic random-access memory (SDRAM), double data rate fourth generation (DDR4) SDRAM, and peripheral component interconnect express (PCIe). The magnitude of voltage swings and pulse frequencies are very high and the complexity of the signaling requires precise electrical probing. These and other busses are becoming highly prevalent in various types of consumer hardware devices. There are many test points of interest in each of these products.

The test points in these products vary greatly in both geometry and accessibility, usually requiring one or two points of contact. Typically, points of contact include micro traces, vias, component pads, and connector contacts that provide electrical contact with and, thus, access to high-speed signals. However, the test points are not always in the same plane and, if two probe contacts are required at once (e.g., as in the case of a differential probe), tip compliance is highly desirable to assist with positioning the probe for proper contact. Points of contact may reside on principal component analysis (PCA) hardware in virtually every angle of orientation, including from vertical to horizontal. In these types of scenarios, the test points are better accessed by probe tips with compliance.

While there are semi-permanent forms of probe contact for these access points, including the soldering or conductive epoxying of wires to these points, such solutions present a number of disadvantages, including potential damage to the device under test (DUT) during connection, long set-up times, and a requirement for exceptional dexterity skills in order to solder wires to these test points. Also, semi-permanent contacts do not provide for quick debugging. Solder-in probe tips tend to wear out after only a few connections and, thus, create a need for replacements, which can be significantly expensive. Finally, there tends to be a high variability in the signal fidelity, particularly in upper signal frequencies, due to the quality and geometry of solder and/or epoxy connections.

Accordingly, there remains a need for improved probe tips for use in connection with test probes.

DETAILED DESCRIPTION

Embodiments of the disclosed technology generally include probe tips suitable for use with a test probe and configured to provide a precise, height-compliant, quick, and light-pressure contact with a test point, e.g., on a device under test (DUT). Such a probe tip may, in some embodiments, be configured as a spring probe that includes a resistive or impedance element positioned nearly at the point of contact with the DUT. The resistive or impedance element may greatly improve the through response of the spring probe and also decrease the DUT loading significantly, thus enabling high-speed signal acquisition.

Test probes and probe tips in accordance with the disclosed technology may advantageously create a better physical and electrical control of the contact area between the components of the probe tip and also lend themselves well to fast debugging environments that typically cannot accommodate long contact setup times. Test probes and probe tips in accordance with the disclosed technology may advantageously provide superior visibility for connection placement and intuitive operation various classes of products, specifically hand-held or rapid placement probing.

Figure 1:
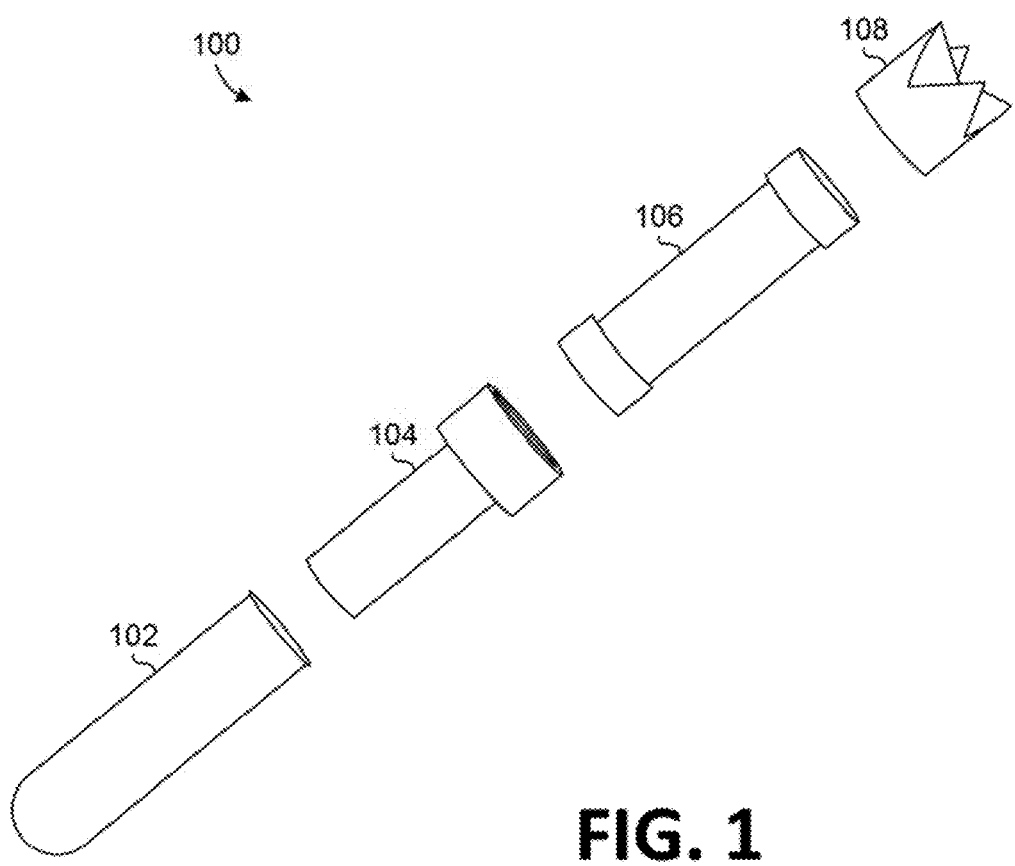
FIG. 1 illustrates an exploded view of an example of a probe tip in accordance with certain embodiments of the disclosed technology.

FIG. 1 illustrates an exploded view of an example of a test probe tip 100 in accordance with certain embodiments of the disclosed technology. In the example, the test probe tip 100 includes an optional compliance member or force deflecting assembly and a tip component 108 coupled therewith.

Figure 6:
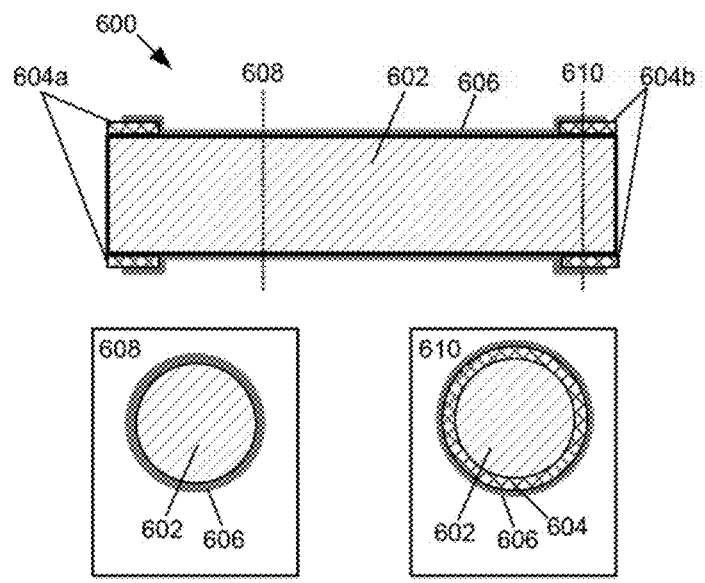
FIG. 6 is a depiction of an example round-rod resistor in accordance with various embodiments of the present disclosure.
Figure 7:
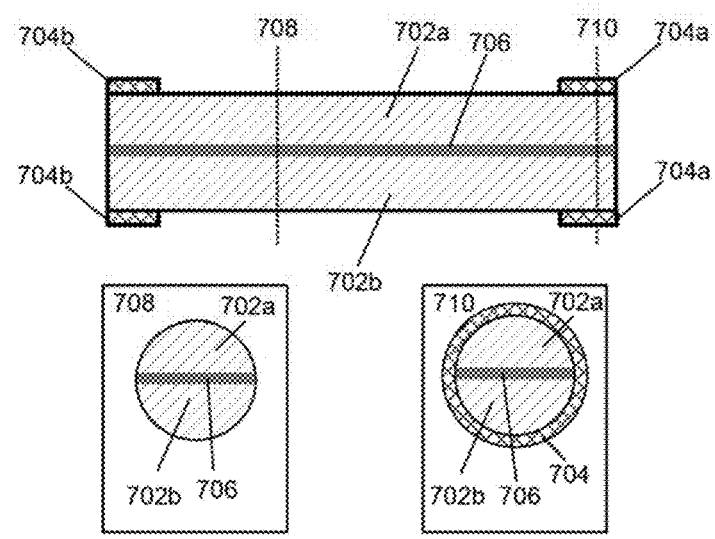
FIG. 7 is a depiction of an example round-rod resistor in accordance with various embodiments of the present disclosure.

In the example, the compliance member or force deflecting assembly includes a barrel component 102 configured to be integrated, or coupled, with a test probe. The probe tip 100 also includes a resistive element 106, e.g., a round rod resistor, and a plunger base component 104 configured to be coupled, e.g., by way of an electro-mechanical bond (e.g., solder, an electrically conductive adhesive, etc.), with an end surface of the resistive element 106. Illustrative resistive elements are depicted in FIGS. 6 and 7, below.

The resistive element 106 may, in some embodiments, have a tube-like form with resistance disposed on the outside circumference thereof. For example, the resistive element 106 may include a resistive coating, or layer, that covers a tube. In addition, to enable the electro-mechanical bond, the resistive element 106 can include metallized contacts disposed on either end of the resistive element 106. The tube-like structure of the resistor may enable high bandwidth, low bandwidth loading. The cylindrical shape of a of the depicted resistive element 106 may advantageously maximize the cross-sectional strength of the resistive element 106. It will be appreciated that, while depicted as being cylindrical, the resistive element 106 could also be implemented utilizing another suitable shape (e.g., octagonal, triangular, etc.).

In the example, the tip component 108 is configured to be coupled, e.g., by way of an electro-mechanical bond, with an end surface of the resistive element 106 opposite the end surface that is coupled with the plunger base component 104. As used herein, an electro-mechanical bond is one that provide electrical connectivity as well as structural/mechanical support. The tip component 108 may have one or more points, e.g., to establish or otherwise facilitate fine-grain electrical connectivity with one or more contact points on a DUT.

A spring mechanism may be trapped or otherwise positioned within the barrel component 102, and the plunger base 104 may be configured to slide axially inside the barrel component 102 and, consequently, be acted upon by the spring mechanism positioned inside the barrel component 102 to advantageously create a compression resistance.

Figure 2:
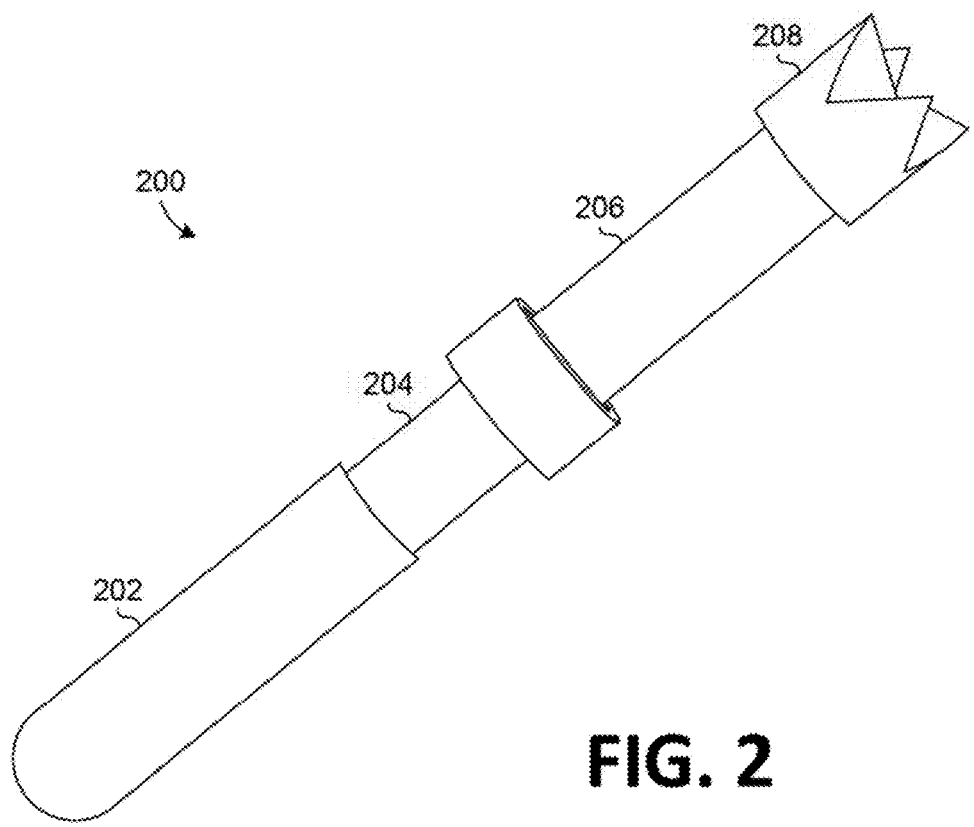
FIG. 2 illustrates an assembled view of the probe tip illustrated by FIG. 1 in accordance with certain embodiments of the disclosed technology.

FIG. 2 illustrates an assembled view of an example of a test probe tip 200 having an optional compliance member or force deflecting assembly and a tip component coupled therewith in accordance with certain embodiments of the disclosed technology. In the example, a barrel component 202 receives a plunger base 204 that is coupled, e.g., by way of an electro-mechanical bond, with an end of a resistive element 206. The resistive element 206 may have a tube-like form with resistance on the outside circumference thereof. In the example, a tip component 208 is coupled, e.g., by way of an electro-mechanical bond, with an end of the resistive element 206 opposite the end thereof that is coupled with the plunger base 204.

As with the test probe tip 100 illustrated by FIG. 1, a spring mechanism may be trapped or otherwise positioned within the barrel component 202, and the plunger base 204 may be configured to slide axially inside the barrel component 202 and be acted upon by the spring mechanism therein to advantageously create a compression resistance.

Figure 3:
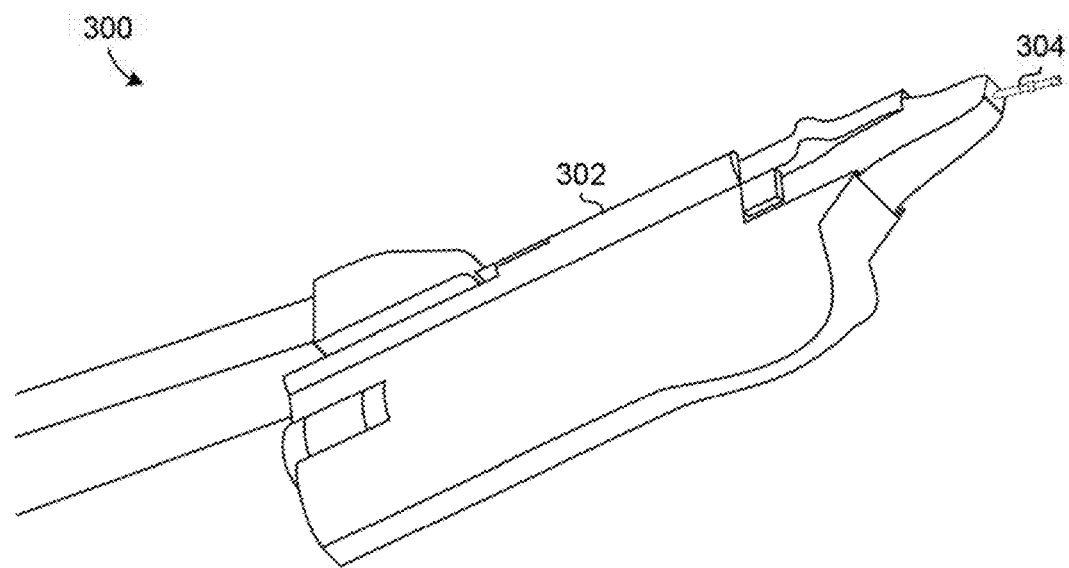
FIG. 3 illustrates an example of a single-tip test probe in accordance with certain embodiments of the disclosed technology.

FIG. 3 illustrates an example of a single-tip test probe 300 in accordance with certain embodiments of the disclosed technology. In the example, the test probe 300 includes a test probe body 302 and a test probe tip 304, such as the test probe tips 100 and 200 illustrated by FIGS. 1 and 2, respectively. A user may use the test probe 300 to create a compression resistance between the test probe tip 304 and a test point, such as a high-speed signal access point or other suitable point on a DUT, for example.

Figure 4:
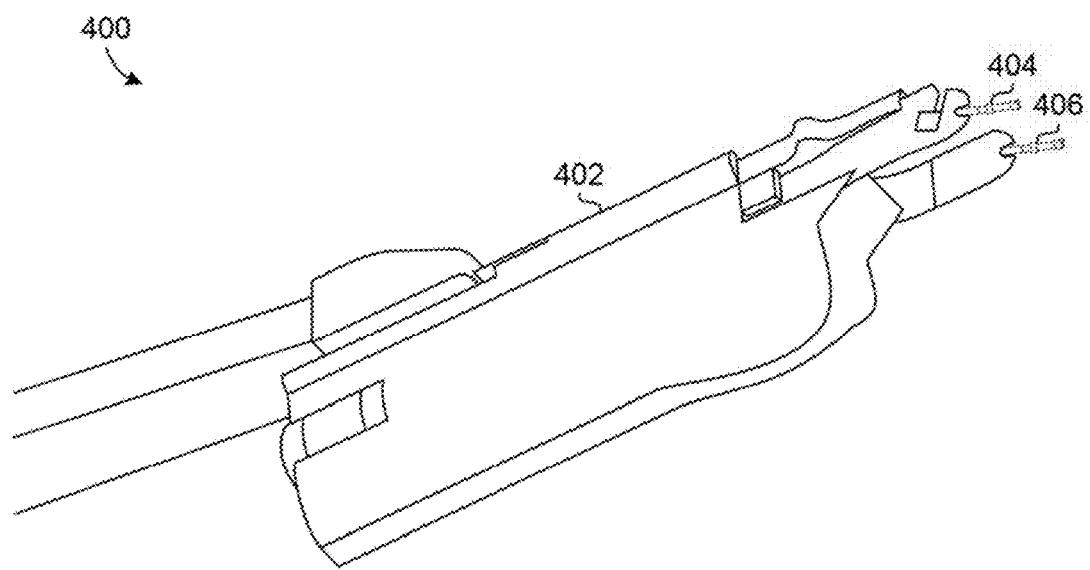
FIG. 4 illustrates an example of a differential probe in accordance with certain embodiments of the disclosed technology.

FIG. 4 illustrates an example of a differential probe 400 in accordance with certain embodiments of the disclosed technology. In the example, the differential probe 400 includes a probe body 402 and two test probe tips 404 and 406, such as the test probe tips 100 and 200 illustrated by FIGS. 1 and 2, respectively. A user may use the differential probe 400 to create a compression resistance between either or both of the test probe tips 404 and 406 and one or two test points, such as a high-speed signal access point or other suitable point on a DUT, for example.

Figure 5:
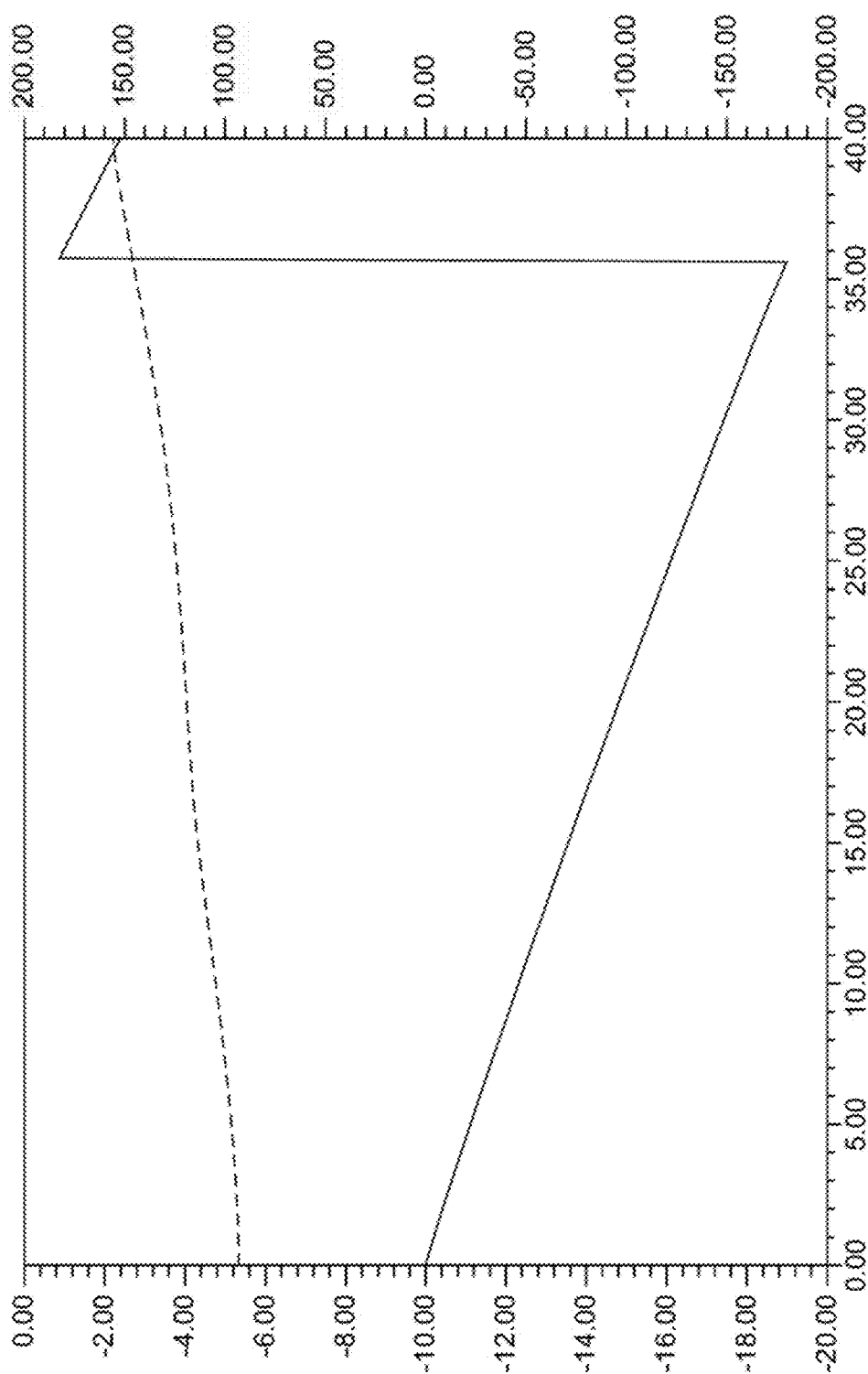
FIG. 5 is a graphical representation of an example of a frequency response plot for a test probe tip in accordance with certain embodiments of the disclosed technology.

FIG. 5 is a graphical representation of an example of a frequency response plot 500 for a test probe tip in accordance with certain embodiments of the disclosed technology. The configuration of the resistor fabrication (e.g., rod tube nature) and close proximity to the contact point of the DUT contact generates a highly flat response to signals on the DUT, yielding high signal reproduction fidelity while keeping DUT loading to a minimum. This is important for measuring signal busses that are sensitive to loading. If the tip/probe input structure loads (e.g., reduces or alters the signal eye) the signaling between transmitter-receiver is interrupted, the communication bus under test fails to work properly, which ruins the test. Probe tips in accordance with the disclosed technology advantageously limits this issue greatly.

FIG. 6 is a depiction of a length-wise cross-section and two width-wise cross-sections along lines 608 and 610, depicted in the boxes with similar numbering of an example resistor 600, in accordance with various embodiments of the present disclosure. As depicted, the resistor includes a structural member 602, a metallic layer 604a and 604b disposed around a circumference of either end of structural member 602, and a resistive layer 606 disposed on an exterior surface of the round rod resistor.

Structural member 602 is composed of material that provides sufficient structural rigidity and sufficient strength to withstand the stresses of probing without breaking. As such, structural member 602 can prevent the need for resistor 600 to be embedded in an encapsulation material. This can be beneficial, because encapsulating the resistor in an encapsulation material, such as, for example, plastic, can have adverse effects on the flatness of the frequency response of the resulting probe tip. To help maintain the flatness of the frequency response, it can be desirable to have the only insulating material surrounding resistor 600 be air, which is enabled, at least in part, by structural member 602. Materials providing sufficient structural rigidity and sufficient strength can vary based on the intended use of the probe tip, but can include zirconium, quartz, or any combination of these. It will be appreciated that these materials are merely meant to be illustrative of possible material and that other possible materials will be readily discernible to a person of ordinary skill in the art. In addition, while structural member 602 is depicted as generally being cylindrical in nature, it will be appreciated that other shapes (e.g., octagonal, triangular, etc.) can be utilized without departing from the scope of this disclosure Metallic layer 604a and 604b can include any suitable material for making an electrical connection with plunger base component 104 and tip component 108. Such materials can include, silver, gold, copper, or any other suitably electrically conductive material, or combinations of any of these. Metallic layer 604a and 604b can be applied utilizing any suitable process, such as a micropenning process, or any other suitable process. The metallic layers can be formed as caps, or could be formed to leave either end of the structural member exposed.

Resistive layer 606 can be a thick film resistive layer. This film can be applied through a micropenning process (e.g., resistive ink, such as that available from Ohmcraft), flat screened, or any other suitable process. Resistive layer 606 can include, for example, oxides of ruthenium, iridium and/or rhenium, or any other suitable material. Resistive layer 606 can be applied to contact metallic layer 604a and 604b either on a surface of the metallic layers or between the metallic layers and the structural member 602. In addition, resistive layer, or any other layer for that matter, may be laser cut for additional precision or to adjust an amount of resistance (e.g., by removing portions of the resistive layer) for the resistor.

FIG. 7 is another depiction of a length-wise cross-section and two width-wise cross-sections along lines 708 and 710, depicted in the boxes with similar numbering of an example resistor 700, in accordance with various embodiments of the present disclosure. As depicted, the resistor includes semi-cylindrical structural members 702a and 702b, a metallic layer 704a and 704b disposed around a circumference of either end of structural member 702, and a resistive layer 706 disposed between structural members 702a and 702b.

Structural members 702a and 702b are composed of material that provides sufficient structural rigidity and sufficient strength to withstand the stresses of probing without breaking. As such, structural member 702 can prevent the need for resistor 700 to be embedded in an encapsulation material. This can be beneficial, because encapsulating the resistor in an encapsulation material, such as, for example, plastic, can have adverse effects on the flatness of the frequency response of the resulting probe tip. To help maintain the flatness of the frequency response, it can be desirable to have the only insulating material surrounding resistor 700 to be air, which is enabled, at least in part, by structural member 702. Materials providing sufficient structural rigidity and sufficient strength can vary based on the intended use of the probe tip, but can include zirconium, quartz, or any combination including one or more of these. It will be appreciated that these materials are merely meant to be illustrative of possible material and that other possible materials will be readily discernible to a person of ordinary skill in the art.

Metallic layer 704a and 704b can include any suitable material for making an electrical connection with plunger base component 104 and tip component 108. Such materials can include, silver, gold, copper, or any other suitably electrically conductive material, or combinations of any of these. Metallic layer 704a and 704b can be applied utilizing any suitable process, such as a micropenning process, or any other suitable process. The metallic layers can be formed as caps, or could be formed to leave either end of the structural member exposed.

Resistive layer 706 can be a thick film resistive layer. This film can be applied through a micropenning process (e.g., resistive ink, such as that available from Ohmcraft), flat screened, or any other suitable process. Resistive layer 706 can include, for example, oxides of ruthenium, iridium and/or rhenium, or any other suitable material. Resistive layer 606 can be applied to contact metallic layer 604a and 604b either on a surface of the metallic layers or between the metallic layers and the structural member 602. In addition, resistive layer, or any other layer for that matter, may be laser cut for additional precision or to adjust an amount of resistance (e.g., by removing portions of the resistive layer) for the resistor.

In conventional test and measurement systems, different types of probes are typically used to couple different types of signals from a device under test (DUT) to a test and measurement instrument, such as an oscilloscope, in order to acquire, visualize, or perform various measurements on the signals. For example, test and measurement probes include voltage probes, current probes, optical probes, and radio-frequency (RF) probes, among others.

A voltage probe is typically used to measure a voltage signal from a DUT. Voltage probes typically connect to a DUT using at least two probe contact points, or probe tips, that physically contact test points on a DUT such as the pin of an integrated circuit (IC), the solder ball of a ball grid array (BGA) device, a via or pad of a printed circuit board (PCB), a connector pin, etc. When measuring a differential voltage signal, the two probe contact points each connect to one of two respective test points of the DUT that each carry one side of the differential signal. When measuring a single-ended signal, one probe contact point connects to a test point on the DUT that carries the signal while the other probe contact point connects to a test point on the DUT that carries a reference voltage, such as the DUT's ground voltage.

A current probe is typically used to measure a current signal from a DUT. Current probes typically connect to a DUT using a non-contact probing method of forming a conductive loop or coil around a current-carrying conductor, such as a wire, in the DUT. The current probe is able to sense the magnitude and direction of the current flowing through the conductor, and produce an electrical output signal that is representative of the current signal. The current probe's conductive loop is typically formed by opening a jaw of the current probe, inserting the conductor into the jaw, and closing the jaw to form the loop. Current probes are often quite bulky due to the mechanical components required.

Embodiments of the presently disclosed technology generally provide a small form-factor solution for probing and measuring either a voltage signal or a current signal, or both in a DUT. In particular, embodiments enable an easy, non-destructive, micro miniature way to measure a current signal within a DUT.

Figure 8:
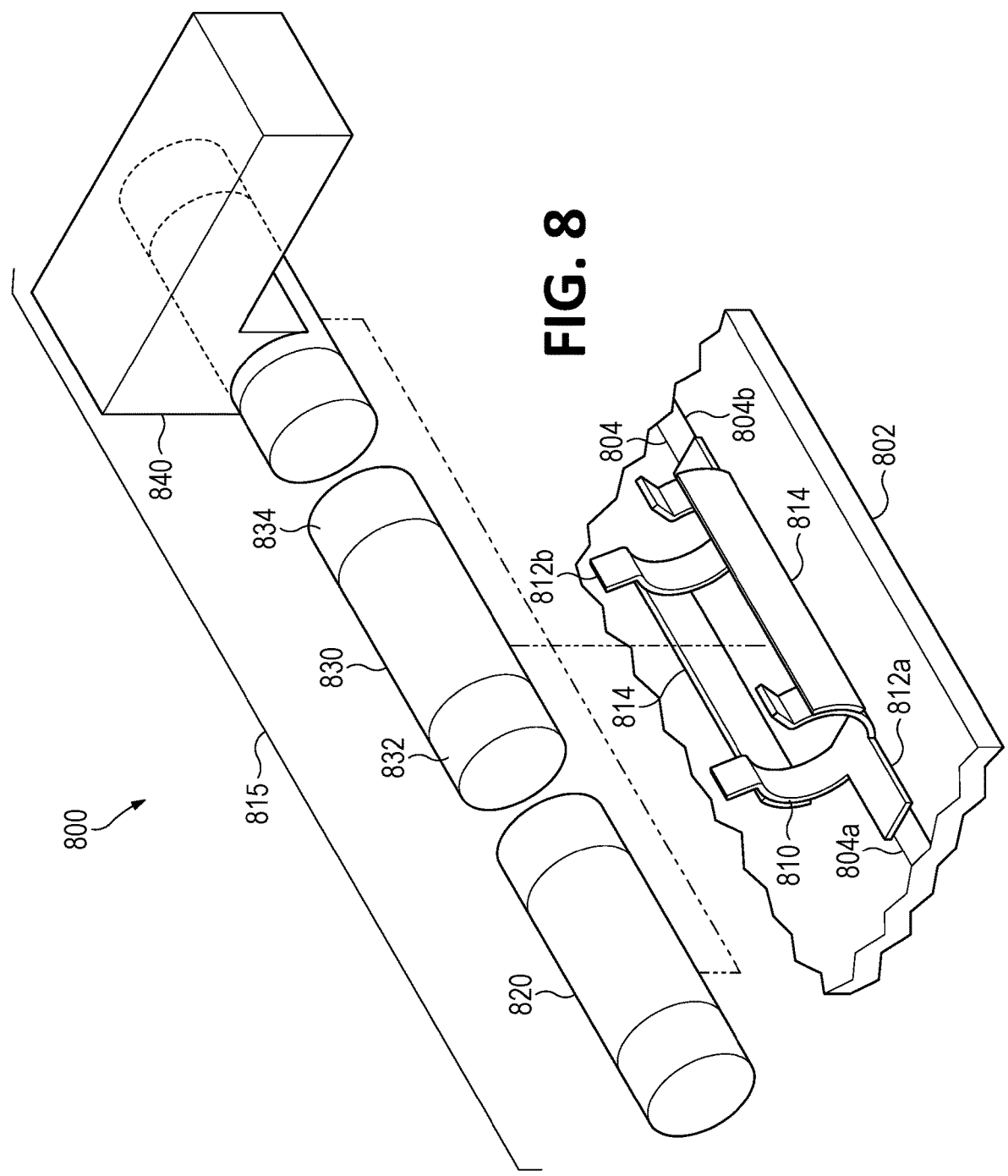
FIG. 8 illustrates an example of an apparatus for coupling a test and measurement instrument to a device under test in accordance with various embodiments of the present disclosure.

As illustrated in FIG. 8, embodiments include an apparatus 800, including a small clip 810 or socket-like device structured to be soldered into a DUT 802. For example, the clip 810 may be soldered between two portions 804a, 804b of a surface trace 804 on a PCB 802. The clip 810 is structured either to be hand-soldered in place, or to be handled by an automated pick and place machine, to be processed by known PCB processing operations in the same manner as other electrical components, e.g. surface-mount technology (SMT) components. Users may design and lay-out a PCB 802 to accommodate the placement of one or more clips 810. In a debug or troubleshooting application, a user may cut a surface trace 804 of a PCB to form a gap in the trace, and then solder the clip 810 in place to bridge the gap. In other embodiments, the clip 810 may be secured to the DUT 802 using a conductive adhesive rather than solder.

Once the clip 810 is installed on the DUT 802, embodiments provide various modes of operation by installing various inserts 815 into the clip. The inserts 815 are structured to be easily installed into, e.g. snapped into, the clip 810, and easily removed from the clip 810 by a user. For example, the inserts 815 may have a round cross-section, making them easier to install into the clip 810 since no specific orientation is required.

In a first exemplary mode, for normal DUT circuit operation, a user may install a zero Ohm insert 820 into the clip. The zero Ohm insert 820 functions as an electrical short, as if the clip/insert combination 800 was not present in the DUT circuit. The zero Ohm insert 820 may comprise a zero Ohm resistor. In preferred embodiments, the resistor may be a round rod resistor with good structural integrity and electrical performance, such as the round rod resistors described above.

In a second exemplary mode, to measure a voltage signal, a user may install a non-zero Ohm resistive insert 830 into the clip 810. In other words, the user may install an insert 830 having a known resistance value. The known resistance value may be selected to be appropriate for the signal being measured. Like the zero Ohm insert 820, the resistive insert 830 may be a round rod resistor with good structural integrity. With the resistive insert 830 installed in the clip 810, a user may measure a voltage signal by, for example, clipping a voltage probe tip onto the clip 810 such that it contacts the two ends 832, 834 of the resistive insert 830. Alternatively, the resistive insert 830 may be integrated into a probe itself, or into a probe tip itself. Also, a current signal may be determined by exploiting the relationship $di/dt=(dv/dt)/R$. Such a determination of a current signal from measured voltage signal may be performed, for example, by an oscilloscope that receives the output signal from the probe.

In a third exemplary mode, the user may install a current-measuring insert 840 into the clip 810. The current-measuring insert 840 may include a very short current loop and a Hall device. This insert 840 provides a shorted circuit connection for the DUT's 802 operation and a micro-Hall device to measure the current signal. Also, a voltage signal may be determined by exploiting the relationship $di/dt=(dv/dt)/R$. Such a determination of a voltage signal from measured current signal may be performed, for example, by an oscilloscope that receives the output signal from the probe.

Figure 9:
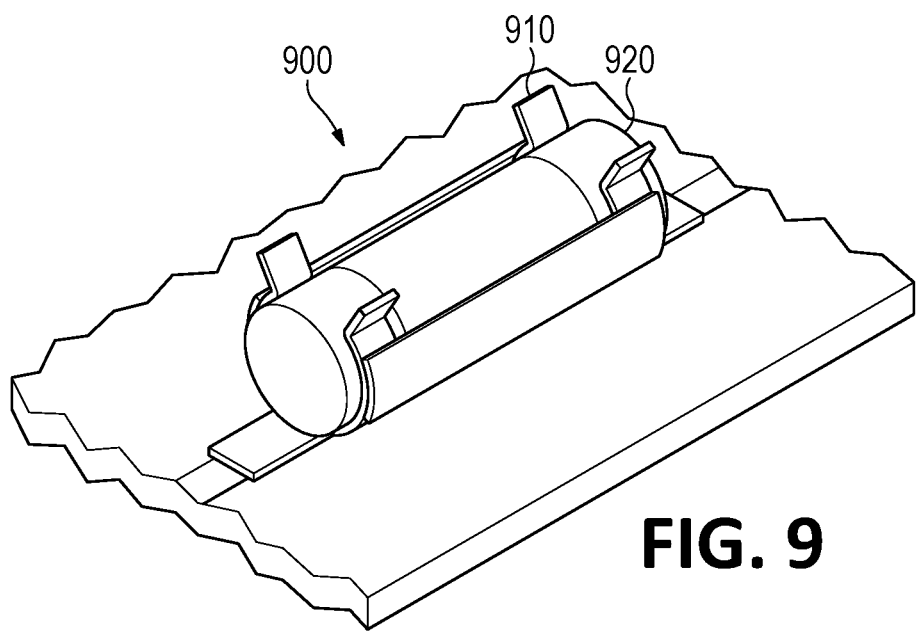
FIG. 9 illustrates an example application of the apparatus of FIG. 8.

FIG. 9 illustrates an exemplary embodiment of an apparatus 900 including a clip 910, as well as a zero-Ohm insert 920 installed into the clip 910. Apparatus 900 may be installed onto a test PCB with a signal trace cut to form a gap, and the clip 910 conductively attached to bridge the gap in the signal trace. The zero-Ohm round rod resistor 920 is installed into the clip.

Figure 10:
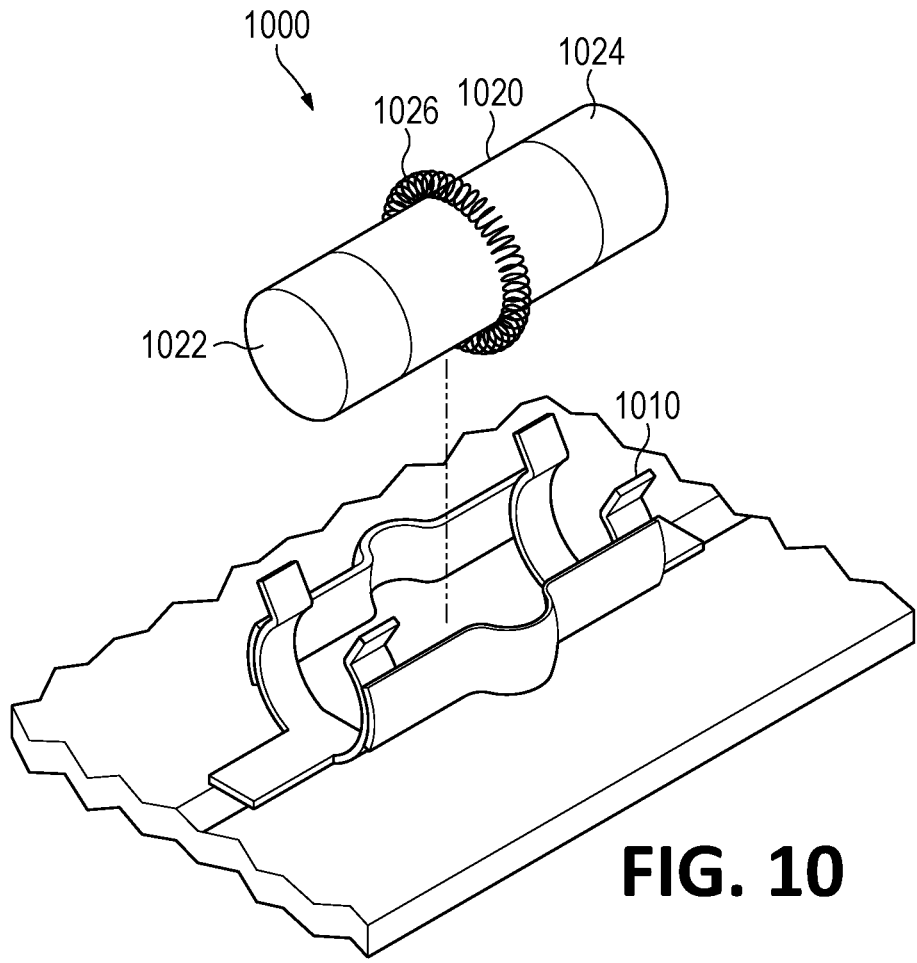
FIG. 10 illustrates another example of an apparatus for coupling a test and measurement instrument to a device under test in accordance with various embodiments of the present disclosure.

FIG. 10 illustrates another exemplary embodiment of the disclosed technology. In the apparatus 1000 shown in FIG. 10, the insert 1020 is a resistive insert with a micro-coil 1026 looped substantially around the perimeter of the insert 1020. As illustrated in FIG. 10, with this combination insert 1020 installed into the clip 1010, a voltage signal may be measured by connecting a probe to the two ends of the insert 1020, for example, by clipping in a corresponding voltage probe tip such that it contacts the two ends 1022, 1024 of the insert 1020. A current signal may be measured by connecting a probe to the two ends of the micro-coil 1026. Also, as mentioned above, a current signal may be determined from a measured voltage signal, and vice-versa, by exploiting the relationship $di/dt=(dv/dt)/R$. Such a determination may be performed, for example, by an oscilloscope that receives the output signal from the probe.

Figure 11:
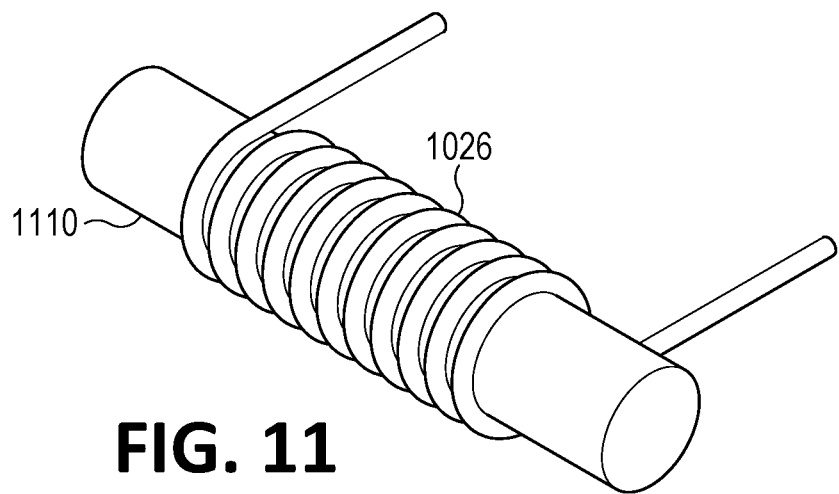
FIG. 11 illustrates an example fabrication technique for a portion of the apparatus of FIG. 10.

As illustrated in FIG. 11, a micro-coil 1026 for a combination insert 1020 may be constructed by wrapping a very thin wire around a pin gauge 1110, for example. FIG. 11 depicts a wire coiled around a 0.011 inch diameter pin gauge.

Figure 12:
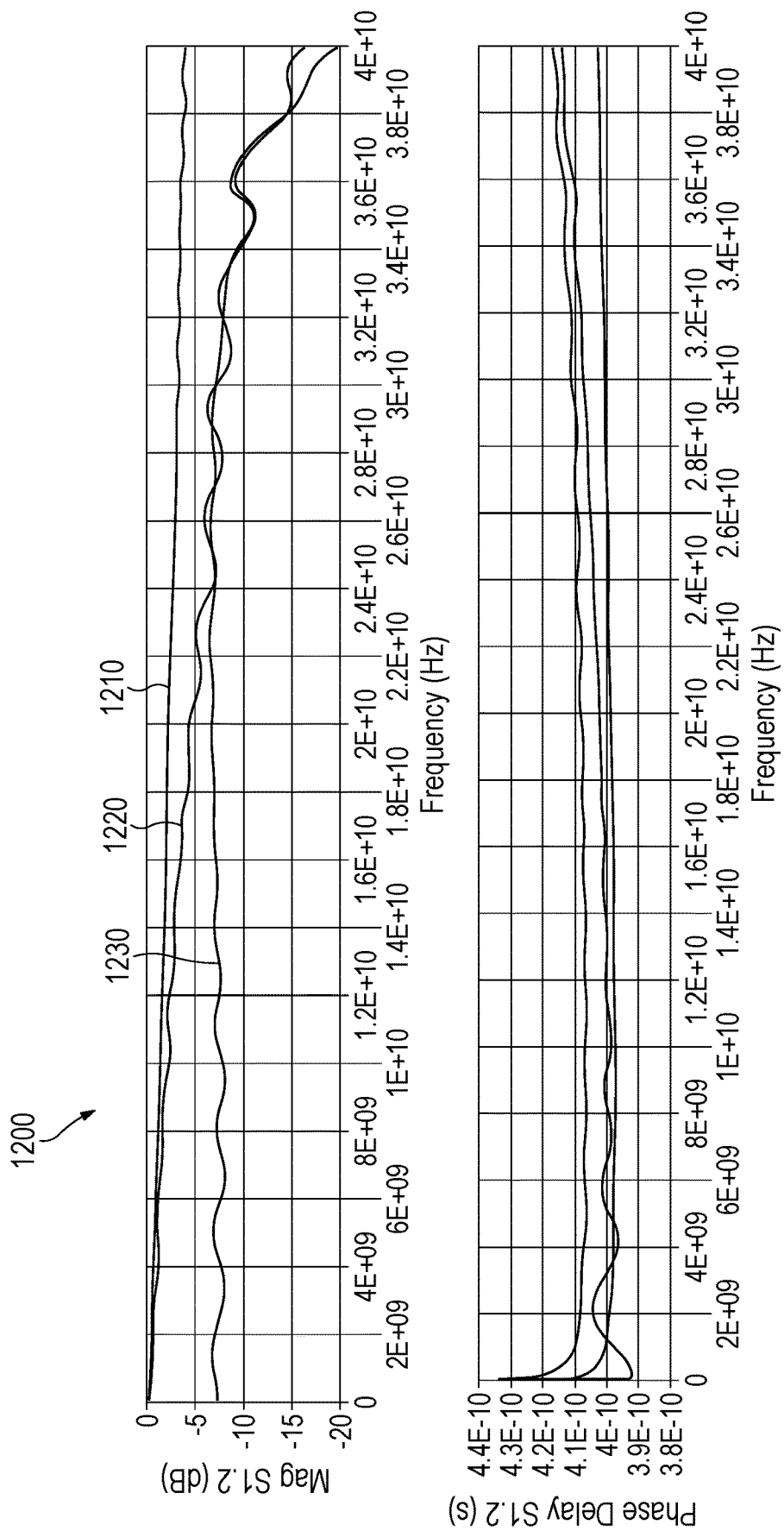
FIG. 12 a graphical representation of an example of a frequency response plot for an apparatus in accordance with certain embodiments of the disclosed technology.

FIG. 12 is a chart 1200 showing a comparison of the frequency response of a test circuit with and without the presence of embodiments the disclosed clip/insert system 800, 900, 1000. Trace 1210 is a trace of the frequency response of the unmodified test circuit, that is, without a clip or insert installed. Trace 1220 is a trace of the frequency response of the test circuit modified to have the clip installed, and a zero Ohm insert installed in the clip. Trace 1230 is a trace of the frequency response of the test circuit modified to have the clip installed, and a resistive insert installed in the clip. As shown in FIG. 12, the frequency response of the modified test circuit tracks the frequency response of the unmodified test circuit reasonably well up to around 20 GHz, and does not begin to substantially deviate from the frequency response of the unmodified test circuit until up above 30 GHz.

Embodiments of the disclosed technology also include other types of inserts to perform other types of signal measurements or testing of a DUT. For example, in some embodiments, a signal injection insert may be installed into the clip to allow a user to easily inject a signal into a circuit in the DUT. This may be useful in measuring a signal subjected to interference or crosstalk. In other exemplary embodiments, a time-domain reflectometry (TDR) or time-domain transmissometry (TDT) insert may be installed into the clip. Such a TDR insert may allow a user to perform a TDR measurement of a DUT circuit on one or both ends of the clip. These inserts may connect to a corresponding probe, or an insert may be integrated into a probe itself, or a probe tip itself.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments that are described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. An apparatus for coupling a test and measurement instrument to a device under test, comprising:
    a clip having a conductive first end, a conductive second end, and a non-conductive member connecting the first and second ends, the clip structured to be attached between two conductive portions of the device under test such that the clip bridges a non-conductive gap between the two conductive portions;
    a first insert structured to be removably installed in the clip, and to provide a substantially unimpeded current path between the two conductive portions of the device under test; and
    a second insert structured to be removably installed in the clip, and to provide a pair of signal measurement points for coupling to the test and measurement instrument, wherein the second insert comprises a portion of a probe tip.

2. The apparatus of claim 1, wherein the first insert comprises a zero Ohm resistor.

3. The apparatus of claim 2, wherein the zero Ohm resistor comprises a round rod resistor.

4. The apparatus of claim 1, wherein the second insert comprises a resistive element having a resistance value, R, greater than zero.

5. The apparatus of claim 4, wherein the resistive element comprises a round rod resistor.

6. The apparatus of claim 4, wherein the resistance value is selected based on an expected magnitude range of a signal to be measured between the two conductive portions of the device under test.

7. The apparatus of claim 4, wherein the two ends of the resistive element provide the pair of signal measurement points, and the pair of signal measurement points are coupled to the test and measurement instrument by a probe.

8. The apparatus of claim 7, wherein the test and measurement instrument is configured to measure a voltage signal, v(t).

9. The apparatus of claim 8, wherein the test and measurement instrument is further configured to determine a current signal, i(t), by using the relationship $di(t)/dt=(dv(t)/dt)/R$.

10. The apparatus of claim 4, further comprising a micro-coil looped around the resistive element, the micro-coil having a pair of leads to provide the pair of signal measurement points.

11. The apparatus of claim 10, wherein the pair of leads provide a voltage signal proportional to a current flowing through the resistive element.

12. The apparatus of claim 10, wherein the pair of leads are coupled to the test and measurement instrument by a probe.

13. The apparatus of claim 12, wherein the test and measurement instrument is configured to determine a magnitude and direction of current flowing through the resistive element based on a voltage signal from the pair of leads.

14. The apparatus of claim 1, wherein the clip is structured to be handled by an automated SMT pick and place machine.

15. The apparatus of claim 1, wherein the second insert comprises a current-measuring insert including a loop of conductive wire providing a substantially unimpeded current path between the two conductive portions of the device under test, and a Hall device for detecting current flowing through the loop, and wherein outputs of the Hall device provide the pair of signal measurement points.

16. The apparatus of claim 15, wherein the second insert is integrated into a current probe.

17. A system, comprising:
a clip having a conductive first end, a conductive second end, and a non-conductive member connecting the first and second ends, the clip structured to be attached between two conductive portions of a device under test such that the clip bridges a non-conductive gap between the two conductive portions;
a first insert structured to be removably installed in the clip, and to provide a substantially unimpeded current path between the two conductive portions of the device under test;
an oscilloscope; and
a probe, wherein a probe tip of the probe includes a second insert structured to be removably installed in the clip, the probe tip configured to output a voltage signal indicative of a current through the second insert, the probe coupling the output of the probe tip to an input of the oscilloscope.

18. The system of claim 17, wherein the first insert and the second insert each comprise a round rod resistor.

19. A method for configuring an operational mode of a device under test, DUT, the method comprising:
attaching a clip between two conductive portions of the DUT such that the clip bridges a non-conductive gap between the two conductive portions, the clip having a conductive first end, a conductive second end, and a non-conductive member connecting the first and second ends;
for a normal operational mode of the DUT, installing a first insert into the clip, the first insert structured to be removably installed in the clip, and to provide a substantially unimpeded current path between the two conductive portions of the DUT; and
for a measurement operational mode of the DUT, installing a second insert into the clip, the second insert structured to be removably installed in the clip, and to provide a pair of signal measurement points for coupling to a test and measurement instrument.

\* \* \* \* \*